United States Patent
Bae et al.

(10) Patent No.: US 10,553,727 B2
(45) Date of Patent: Feb. 4, 2020

(54) THIN FILM TRANSISTOR, METHOD OF MANUFACTURING THE SAME, AND ORGANIC LIGHT EMITTING DISPLAY DEVICE INCLUDING THE SAME

(71) Applicant: LG Display Co., Ltd., Seoul (KR)

(72) Inventors: JongUk Bae, Seoul (KR); YongHo Jang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/858,679

(22) Filed: Dec. 29, 2017

(65) Prior Publication Data

US 2018/0190824 A1 Jul. 5, 2018

(30) Foreign Application Priority Data

Dec. 30, 2016 (KR) .......................... 10-2016-0184043

(51) Int. Cl.
*H01L 29/78* (2006.01)
*H01L 27/32* (2006.01)
*H01L 29/786* (2006.01)
*H01L 29/66* (2006.01)

(52) U.S. Cl.
CPC ...... *H01L 29/7869* (2013.01); *H01L 27/3248* (2013.01); *H01L 27/3276* (2013.01); *H01L 29/66969* (2013.01); *H01L 29/78648* (2013.01)

(58) Field of Classification Search
CPC ... H01L 29/78; H01L 29/786; H01L 29/7864; H01L 29/7869; H01L 29/78648; H01L 27/32; H01L 27/326; H01L 27/3262; H01L 27/327; H01L 27/3276
USPC .......................................................... 257/40
See application file for complete search history.

(56) References Cited

U.S. PATENT DOCUMENTS

2016/0013212 A1* 1/2016 Im .......................... H01L 24/05
257/43

OTHER PUBLICATIONS

K. Park et al., A poly-Si AMOLED display with high uniformity; Solid-State Electronics 52 (2008) 1691-1693.

* cited by examiner

*Primary Examiner* — Monica D Harrison
(74) *Attorney, Agent, or Firm* — Polsinelli PC

(57) ABSTRACT

Disclosed are a thin film transistor, a method of manufacturing the same, and an organic light emitting display device including the same, in which a driving stability of a driving transistor is enhanced even without connecting a source electrode to a bottom gate electrode of the driving transistor. The film transistor includes a N-type semiconductor layer, a P-type semiconductor layer on the N-type semiconductor layer, a first gate electrode on the P-type semiconductor layer, a gate insulation layer between the first gate electrode and the P-type semiconductor layer, a first source electrode connected to a first side of the P-type semiconductor layer, and a first drain electrode connected to a second side of the P-type semiconductor layer.

20 Claims, 12 Drawing Sheets

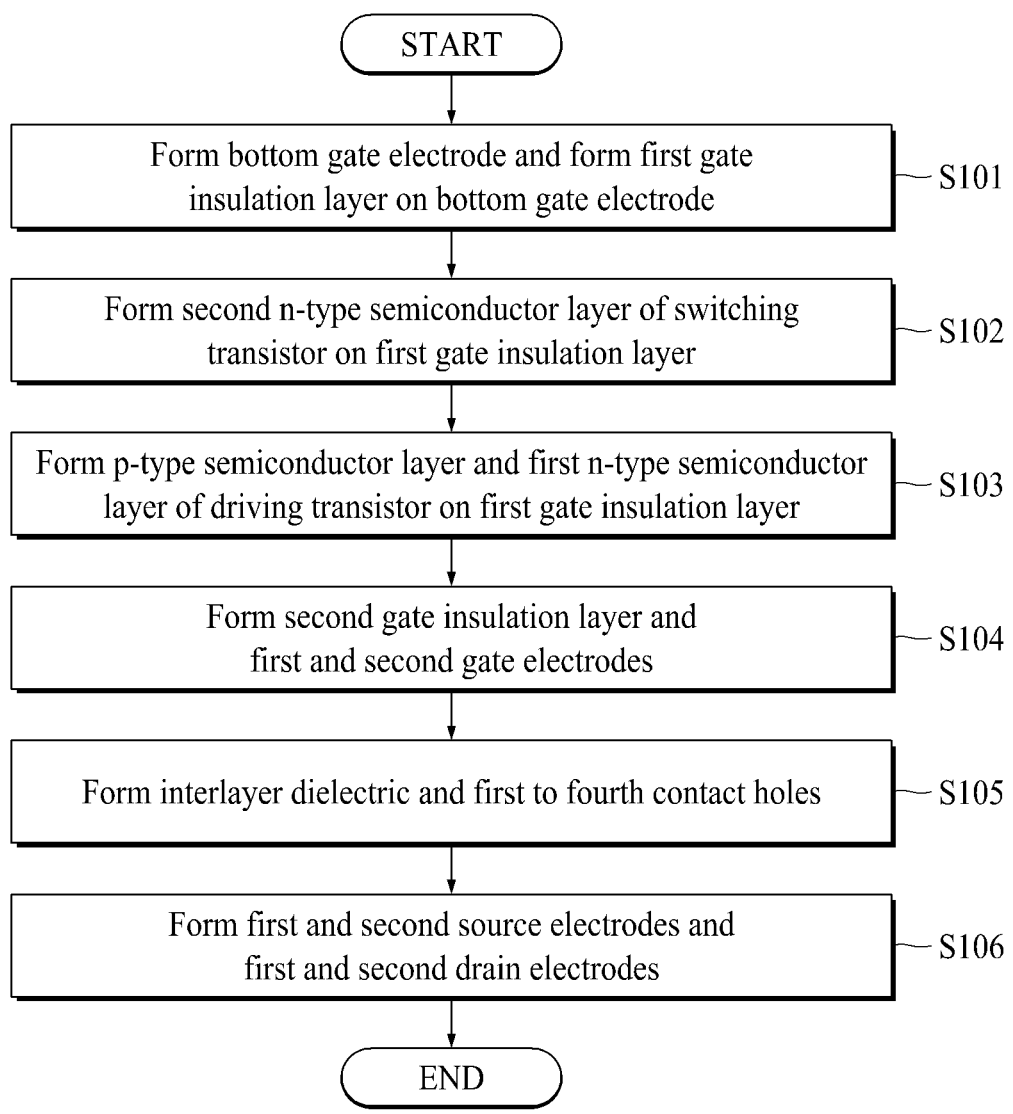

THIN FILM TRANSISTOR, METHOD OF MANUFACTURING THE SAME, AND ORGANIC LIGHT EMITTING DISPLAY DEVICE INCLUDING THE SAME

CROSS-REFERENCE TO RELATED APPLICATION

This application claims the benefit of the Korean Patent Application No. 10-2016-0184043 filed on Dec. 30, 2016, which is hereby incorporated by reference in its entirety as if fully set forth herein.

BACKGROUND

Field of the Disclosure

The present disclosure relates to a display device, and more particularly, to a thin film transistor, a method of manufacturing the same, and an organic light emitting display device including the same.

Description of the Background

With the advent of the information society, various requirements for display devices for displaying an image are increasing. Therefore, various flat panel display devices such as liquid crystal display (LCD) devices, plasma display panel (PDP) devices, organic light emitting display devices, etc. are being used recently.

Flat panel display devices such as LCD devices and organic light emitting display devices include a display panel, a gate driving circuit, a data driving circuit, and a timing controller. The display panel includes a plurality of data lines, a plurality of gate lines, and a plurality of pixels which are respectively provided in a plurality of areas defined at the intersections of the data lines and the gate lines and are supplied with data voltages of the data lines when gate signals are supplied to the gate lines. The pixels emit lights having certain brightness with the data voltages.

Moreover, the flat panel display devices drive the pixels and the gate driving circuit by using a thin film transistor (TFT) as a switching element. The TFT may be a metal oxide semiconductor field effect transistor (MOSFET) that controls a flow of current with an electric field.

In a case where a flat panel display device is implemented as an organic light emitting display device, each of the pixels may include an organic light emitting diode (OLED), a driving transistor that controls the amount of current supplied to the OLED according to a voltage of a gate electrode thereof, and a switching transistor that supplies a data voltage of a data line to a gate electrode of the driving transistor in response to a gate signal (or a scan signal) of a gate line (or a scan line).

The driving transistor may be implemented as an N-type TFT having an N-type semiconductor characteristic. In this case, the driving transistor may be implemented in a coplanar structure having a top gate type.

In the top gate type, an active layer of the driving transistor can be affected by external noise and/or the like, and for this reason, as in FIG. 1A, a drain-source current Ids of the driving transistor can continuously increase with increase in a drain-source voltage Vds. That is, a driving stability of the driving transistor can be reduced.

In order to solve such a problem, a bottom gate electrode is located to overlap the active layer of the driving transistor and is connected to a source electrode. As a result, as shown in FIG. 1B, the constant drain-source current Ids of the driving transistor can be maintained in the drain-source voltage Vds or higher. That is, a driving stability of the driving transistor can be enhanced.

In FIGS. 1A and 1B, the X axis represents the drain-source voltage Vds of the driving transistor, and the Y axis represents the drain-source current Ids of the driving transistor.

However, when the bottom gate electrode is located to overlap the active layer of the driving transistor and is connected to the source electrode, an area of the driving transistor increases, and a contact hole process for connecting the bottom gate electrode and the source electrode is needed.

SUMMARY

Accordingly, the present disclosure is directed to provide a thin film transistor, a method of manufacturing the same, and an organic light emitting display device including the same that substantially obviate one or more problems due to limitations and disadvantages of the related art.

An aspect of the present disclosure is directed to provide a thin film transistor, a method of manufacturing the same, and an organic light emitting display device including the same, in which a driving stability of a driving transistor is enhanced even without connecting a source electrode to a bottom gate electrode of the driving transistor.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a thin film transistor including a N-type semiconductor layer, a P-type semiconductor layer on the N-type semiconductor layer, a first gate electrode on the P-type semiconductor layer, a gate insulation layer between the first gate electrode and the P-type semiconductor layer, a first source electrode connected to a first side of the P-type semiconductor layer, and a first drain electrode connected to a second side of the P-type semiconductor layer.

In another aspect of the present disclosure, there is provided a method of manufacturing a thin film transistor including forming a first N-type semiconductor layer and a P-type semiconductor layer of a first thin film transistor and a second N-type semiconductor layer of a second thin film transistor, on a first gate insulation layer; forming a second gate insulation layer on the P-type semiconductor layer and forming the second gate insulation on the second N-type semiconductor layer; forming a first gate electrode overlapping the P-type semiconductor layer on the second gate insulation layer and a second gate electrode overlapping the second N-type semiconductor layer on the second gate insulation layer; forming an interlayer dielectric on the first gate electrode and the second gate electrode; forming first and second contact holes, exposing the P-type semiconductor layer to pass through the interlayer dielectric, and third and fourth contact holes exposing the second N-type semiconductor layer; and forming a first source electrode connected to the P-type semiconductor layer through the first contact hole, a first drain electrode connected to the P-type semiconductor layer through the second contact hole, a second source electrode connected to the second N-type semiconductor layer through the third contact hole, and a second drain electrode connected to the second N-type semiconductor layer through the fourth contact hole, on the interlayer dielectric.

In another aspect of the present disclosure, there is provided an organic light emitting display device including a pixel connected to a scan line and a data line. The pixel includes an organic light emitting diode, a first thin film transistor, and a second thin film transistor. The first thin film transistor includes a first N-type semiconductor layer and a P-type semiconductor layer disposed on the first N-type semiconductor layer. The second thin film transistor includes a second N-type semiconductor layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings:

FIG. 9 is a flowchart illustrating a method of manufacturing a driving transistor and a first switching transistor according to an aspect of the present disclosure;

DETAILED DESCRIPTION

Figure 1A:
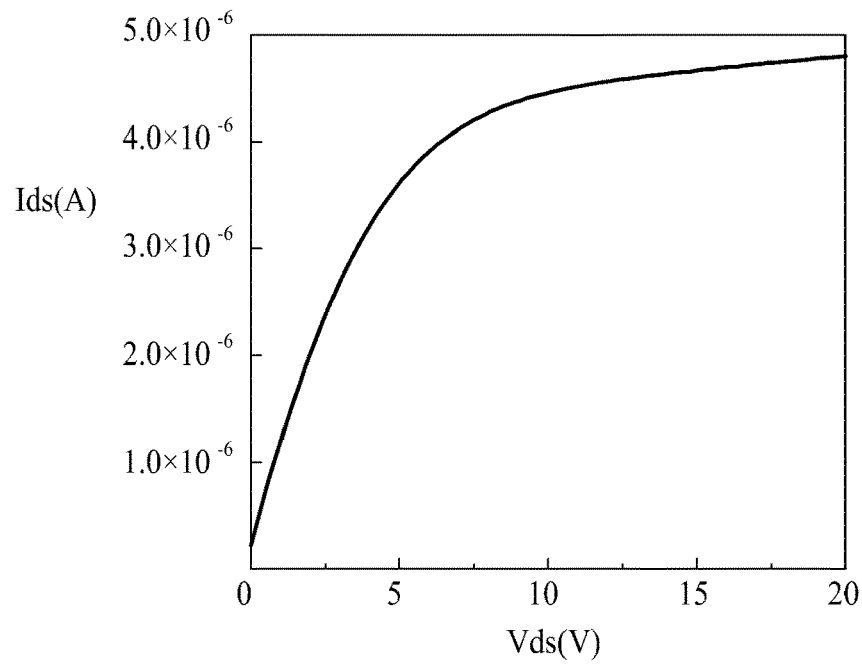
FIGS. 1A and 1B are graphs showing a drain-source current with respect to a drain-source voltage of a driving transistor when a bottom gate electrode is not applied and when the bottom gate electrode is applied, respectively.

Reference will now be made in detail to the exemplary aspects of the present disclosure, examples of which are illustrated in the accompanying drawings. Wherever possible, the same reference numbers will be used throughout the drawings to refer to the same or like parts.

In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An X axis direction, a Y axis direction, and a Z axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, exemplary aspects of the present disclosure will be described in detail with reference to the accompanying drawings.

Figure 2:
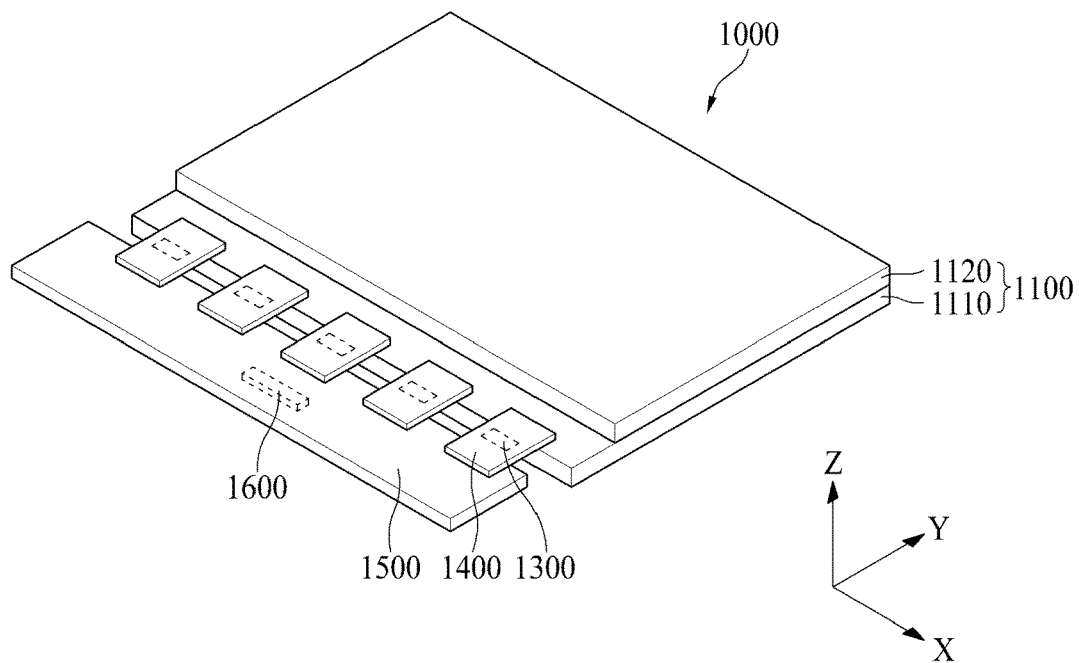
FIG. 2 is a perspective view illustrating an organic light emitting display device according to an aspect of the present disclosure.
Figure 3:
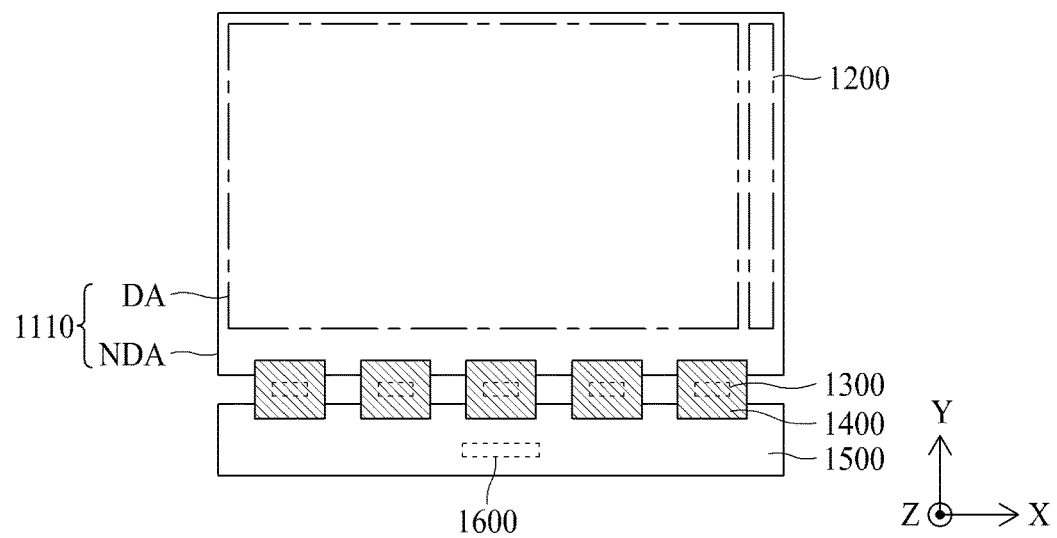
FIG. 3 is a plan view illustrating a first substrate, a gate driver, a source drive integrated circuit (IC), a flexible film, a circuit board, and a timing controller illustrated in FIG. 2.

FIG. 2 is a perspective view illustrating an organic light emitting display device 1000 according to an aspect of the present disclosure. FIG. 3 is a plan view illustrating a first substrate, a gate driver, a source drive integrated circuit (IC), a flexible film, a circuit board, and a timing controller illustrated in FIG. 2.

Referring to FIGS. 2 and 3, the organic light emitting display device 1000 according to an aspect of the present disclosure may include a display panel 1100, a gate driver 1200, a source drive IC 1300, a flexible film 1400, a circuit board 1500, and a timing controller 1600. A display device according to an aspect of the present disclosure may be implemented as one of a liquid crystal display (LCD) device, an organic light emitting display device, a field emission display device, and an electrophoresis display device.

The display panel 1100 may include a first substrate 1110 and a second substrate 1120. The second substrate 1120 may be an encapsulation substrate. The first substrate 1110 and the second substrate 1120 may be a plastic film, a glass substrate, or the like.

A plurality of gate lines, a plurality of data lines, and a plurality of pixels P may be provided on one surface of the first substrate 1110 facing the second substrate 1120. The pixels P may be respectively provided in a plurality of areas defined at an intersection structure of the gate lines and the date lines.

The display panel 1100, as illustrated in FIG. 3, may be divided into a display area DA, where the pixels are provided to display an image, and a non-display area NDA which does not display an image. The gate lines, the data lines, and the pixels P may be provided in the display area DA. The gate driver 1200, a plurality of pads, and a plurality of link lines connecting the data lines to the pads may be provided in the non-display area NDA.

The gate driver 1200 may sequentially supply gate signals to the gate lines according to a gate control signal input from the timing controller 1600. The gate driver 1200 may be provided in the non-display area NDA outside one side or both sides of the display area DA of the display panel 1100 in a gate driver-in panel (GIP) type.

The source drive IC 1300 may receive digital video data and a source control signal from the timing controller 1600. The source drive IC 1300 may convert the digital video data into analog data voltages according to the source control signal and may respectively supply the analog data voltages to the data lines. If the source drive IC 1300 is manufactured as a driving chip, the source drive IC 1300 may be mounted on the flexible film 1400 in a chip-on film (COF) type or a chip-on plastic (COP) type.

A plurality of pads such as data pads may be provided in the non-display area NDA of the display panel 1100. Lines connecting the pads to the source drive IC 1300 and lines connecting the pads to lines of the circuit board 1500 may be provided on the flexible film 1400. The flexible film 1400 may be attached on the pads by using an anisotropic conductive film, and thus, the pads may be connected to the lines of the flexible film 1400.

The circuit board 1500 may be attached on the flexible film 1400, which is provided with a plurality of flexible films. A plurality of circuits implemented as driving chips may be mounted on the circuit board 1500. For example, the timing controller 1600 may be mounted on the circuit board 1500. The circuit board 1500 may be a printed circuit board (PCB) or a flexible printed circuit board (FPCB).

The timing controller 1600 may receive the digital video data and a timing signal from an external system board (not shown) through a cable of the circuit board 1500. The timing controller 1600 may generate a gate control signal for controlling an operation timing of the gate driver 1200 and a source control signal for controlling the source drive IC 1300 which is provided in plurality, based on the timing signal. The timing controller 1600 may supply the gate control signal to the gate driver 1200 and may supply the source control signal to the plurality of source drive ICs 1300.

Figure 4:
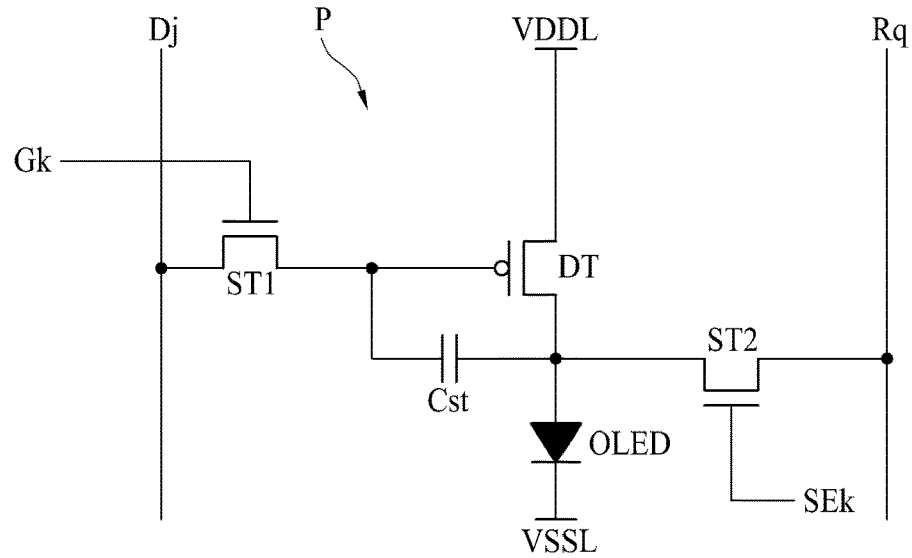
FIG. 4 is a circuit diagram illustrating an example of a pixel provided in a display area of FIG. 3.

FIG. 4 is a circuit diagram illustrating an example of a pixel provided in the display area of FIG. 3.

In FIG. 4, for convenience of description, only a pixel P connected to a $j^{th}$ (where j is an integer equal to or more than two) data line Dj, a $q^{th}$ (where q is an integer equal to or more than two) reference voltage line Rq, a $k^{th}$ (where k is an integer equal to or more than two) gate line Gk, and a $k^{th}$ (where k is an integer equal to or more than two) initialization line SEk is illustrated.

Referring to FIG. 4, the pixel P may include an organic light emitting diode OLED, a driving transistor DT, a plurality of switching transistors ST1 and ST2, and a capacitor Cst. The plurality of switching transistors ST1 and ST2 may include first and second switching transistors ST1 and ST2.

The organic light emitting diode OLED may emit light with a current supplied through the driving transistor DT. An anode electrode of the organic light emitting diode OLED may be connected to a source electrode of the driving transistor DT, and a cathode electrode may be connected to a first source voltage line VSSL through which a first source voltage is supplied. The first source voltage line VSSL may be a low-level voltage line through which a low-level source voltage is supplied.

The organic light emitting diode OLED may include the anode electrode, a hole transporting layer, an organic light emitting layer, an electron transporting layer, and the cathode electrode. When a voltage is applied to the cathode electrode and the anode electrode of the organic light emitting diode OLED, a hole and an electron may respectively move to the organic light emitting layer through the hole transporting layer and the electron transporting layer and may be combined with each other in the organic light emitting layer to emit light.

The driving transistor DT may be implemented as a P-type semiconductor transistor having a P-type semiconductor characteristic. For example, the P-type semiconductor transistor may be a P-type metal oxide semiconductor field effect transistor (MOSFET). The driving transistor DT may be disposed between the organic light emitting diode OLED and a second source voltage line VDDL through which a second source voltage is supplied. The driving transistor DT may control the current flowing from the second source voltage line VDDL to the organic light emitting diode OLED, based on a voltage difference between a gate electrode and a source electrode of the driving transistor DT. The gate electrode of the driving transistor DT may be connected to a first electrode of the first switching transistor ST1, the source electrode may be connected to the second source voltage line VDDL, and a drain electrode may be connected to the anode electrode of the organic light emitting diode OLED. The second source voltage line VDDL may be a high-level source voltage line through which a high-level source voltage is supplied.

The first switching transistor ST1 may be implemented as an N-type semiconductor transistor having an N-type semiconductor characteristic. For example, the N-type semiconductor transistor may be an N-type MOSFET. The first switching transistor ST1 may be turned on by a kth gate signal of the kth gate line Gk and may supply a voltage of the jth data line Dj to the gate electrode of the driving transistor DT. A gate electrode of the first switching transistor ST1 may be connected to the kth gate line Gk, a source electrode may be connected to the gate electrode of the driving transistor DT, and a drain electrode may be connected to the jth data line Dj.

The second switching transistor ST2 may be implemented as an N-type semiconductor transistor. The second switching transistor ST2 may be turned on by a $k^{th}$ initialization signal of the $k^{th}$ initialization line SEk and may connect the $q^{th}$ reference voltage line Rq to the drain electrode of the driving transistor DT. A gate electrode of the second switching transistor ST2 may be connected to the $k^{th}$ initialization line SEk, a first electrode may be connected to the CO reference voltage line Rq, and a second electrode may be connected to the drain electrode of the driving transistor DT.

The capacitor Cst may be provided between the gate electrode and the source electrode of the driving transistor DT. The capacitor Cst may store a difference voltage between a gate voltage and a source voltage of the driving transistor DT.

One electrode of the capacitor Cst may be connected to the gate electrode of the driving transistor DT and the source electrode of the first switching transistor ST1, and the other electrode may be connected to the source electrode of the driving transistor DT, the drain electrode of the second switching transistor ST2, and the anode electrode of the organic light emitting diode OLED.

In an aspect of the present disclosure, the driving transistor DT may be implemented as a P-type semiconductor transistor. If the driving transistor DT is implemented as an N-type semiconductor transistor, the source electrode may be connected to the anode electrode of the organic light emitting diode OLED, or if the driving transistor DT is implemented as a P-type semiconductor transistor, the source electrode may be connected to the second source voltage line VDDL. Therefore, a current is more easily controlled in a case, where the driving transistor DT is implemented as the P-type semiconductor transistor, than a case where the driving transistor DT is implemented as the N-type semiconductor transistor.

Figure 5:
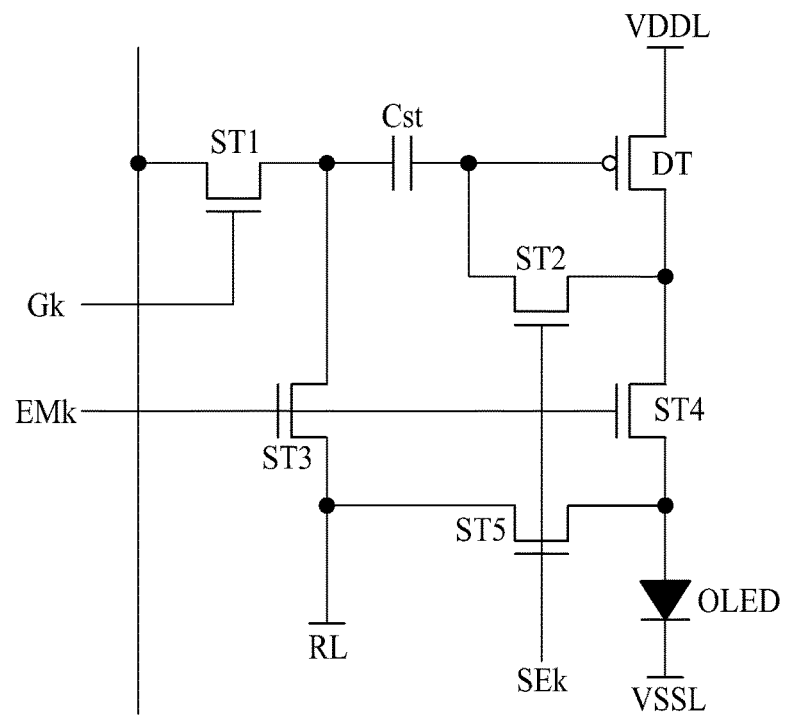
FIG. 5 is a circuit diagram illustrating another example of a pixel provided in a display area of FIG. 3.

FIG. 5 is a circuit diagram illustrating another example of a pixel provided in the display area of FIG. 3. In FIG. 5, for convenience of description, only a pixel P connected to a $j^{th}$ (where j is an integer equal to or more than two) data line Dj, a $k^{th}$ (where k is an integer equal to or more than two) gate line Gk, a $k^{th}$ (where k is an integer equal to or more than two) initialization line SEk, and a $k^{th}$ (where k is an integer equal to or more than two) emission line EMk is illustrated.

Referring to FIG. 5, the pixel P may include an organic light emitting diode OLED, a driving transistor DT, a plurality of switching transistors ST1 to ST5, and a capacitor Cst. The plurality of switching transistors ST1 to ST5 may include first to fifth switching transistors ST1 to ST5.

The organic light emitting diode OLED may emit light with a current supplied through the driving transistor DT. An anode electrode of the organic light emitting diode OLED may be connected to a drain electrode of the driving transistor DT, and a cathode electrode may be connected to a first source voltage line VSSL through which a first source voltage is supplied. The first source voltage line VSSL may be a low-level voltage line through which a low-level source voltage is supplied.

The organic light emitting diode OLED may include the anode electrode, a hole transporting layer, an organic light emitting layer, an electron transporting layer, and the cathode electrode. When a voltage is applied to the cathode electrode and the anode electrode of the organic light emitting diode OLED, a hole and an electron may respectively move to the organic light emitting layer through the hole transporting layer and the electron transporting layer and may be combined with each other in the organic light emitting layer to emit light.

The driving transistor DT may be implemented as a P-type semiconductor transistor. The driving transistor DT may be disposed between the organic light emitting diode OLED and a second source voltage line VDDL through which a second source voltage is supplied. The driving transistor DT may control a current flowing from the second source voltage line VDDL to the organic light emitting diode OLED, based on a voltage difference between a gate electrode and a source electrode of the driving transistor DT. The gate electrode of the driving transistor DT may be connected to one electrode of the capacitor Cst and a second electrode of the second switching transistor ST2, the source electrode may be connected to the second source voltage line VDDL, and a drain electrode may be connected to the anode electrode of the organic light emitting diode OLED. The second source voltage line VDDL may be a high-level source voltage line through which a high-level source voltage is supplied.

The first switching transistor ST1 may be implemented as an N-type semiconductor transistor. The first switching transistor ST1 may be turned on by a kth gate signal of the $k^{th}$ gate line Gk and may supply a voltage of the $j^{th}$ data line Dj to the other electrode of the capacitor Cst. A gate electrode of the first switching transistor ST1 may be connected to the kth gate line Gk, a source electrode may be connected to the other electrode of the capacitor Cst, and a drain electrode may be connected to the $j^{th}$ data line Dj.

The second switching transistor ST2 may be implemented as an N-type semiconductor transistor. The second switching transistor ST2 may be turned on by a kth initialization signal of the $k^{th}$ initialization line SEk and may connect the gate electrode and the drain electrode of the driving transistor DT. A gate electrode of the second switching transistor ST2 may be connected to the kth initialization line SEk, a source electrode may be connected to the gate electrode of the driving transistor DT, and a drain electrode may be connected to the drain electrode of the driving transistor DT.

The third switching transistor ST3 may be implemented as an N-type semiconductor transistor. The third switching transistor ST3 may be turned on by a $k^{th}$ emission signal of the $k^{th}$ emission line EMk and may initialize the other electrode of the capacitor Cst to a reference voltage. A gate electrode of the third switching transistor ST3 may be connected to the $k^{th}$ emission line EMk, a source electrode may be connected to a reference line RL through which the reference voltage is supplied, and a drain electrode may be connected to the other electrode of the capacitor Cst.

The fourth switching transistor ST4 may be implemented as an N-type semiconductor transistor. The fourth switching transistor ST4 may be turned on by the kth emission signal of the $k^{th}$ emission line EMk and may connect the drain electrode of the driving transistor DT to the anode electrode of the organic light emitting diode OLED. A gate electrode of the fourth switching transistor ST4 may be connected to the $k^{th}$ emission line EMk, a source electrode may be connected to the anode electrode of the organic light emitting diode OLED, and a drain electrode may be connected to the drain electrode of the driving transistor DT.

The fifth switching transistor ST5 may be implemented as an N-type semiconductor transistor. The fifth switching transistor ST5 may be turned on by the kth initialization signal of the $k^{th}$ initialization line SEk and may initialize the anode electrode of the organic light emitting diode OLED to the reference voltage. A gate electrode of the fifth switching transistor ST5 may be connected to the kth initialization line SEk, a source electrode may be connected to the reference voltage line RL, and a drain electrode may be connected to the anode electrode of the organic light emitting diode OLED.

The capacitor Cst may be provided between the gate electrode of the driving transistor DT and the second electrode of the first switching transistor ST1. The capacitor Cst may store a difference voltage between a voltage at the gate electrode of the driving transistor DT and a voltage at the second electrode of the first switching transistor ST1.

One electrode of the capacitor Cst may be connected to the gate electrode of the driving transistor DT and the second electrode of the second switching transistor ST2, and the other electrode may be connected to the source electrode of the first switching transistor ST1 and the drain electrode of the third switching transistor ST3.

In an aspect of the present disclosure, the driving transistor DT may be implemented as a P-type semiconductor transistor. If the driving transistor DT is implemented as an N-type semiconductor transistor, the source electrode may be connected to the anode electrode of the organic light emitting diode OLED, or if the driving transistor DT is implemented as a P-type semiconductor transistor, the source electrode may be connected to the second source voltage line VDDL. Therefore, a current is more easily controlled in a case, where the driving transistor DT is implemented as the P-type semiconductor transistor, than a case where the driving transistor DT is implemented as the N-type semiconductor transistor.

Figure 6:
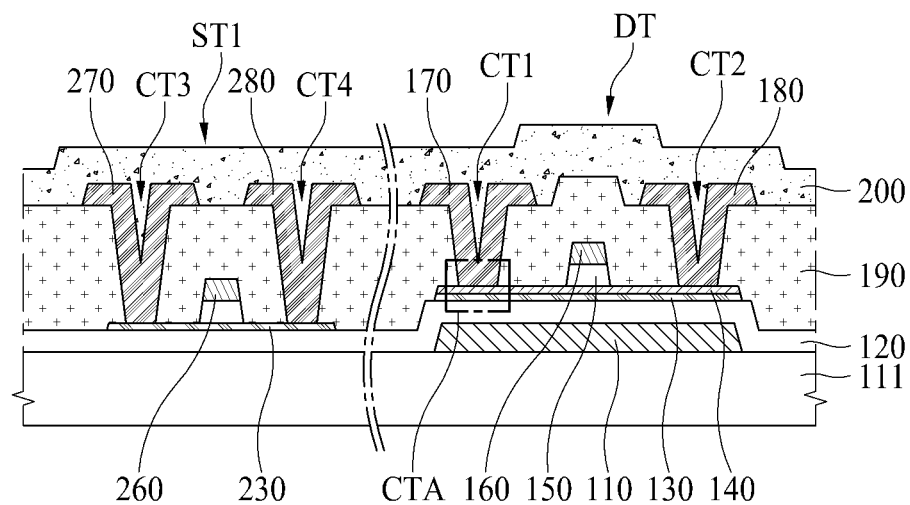
FIG. 6 is a cross-sectional view illustrating an example of a driving transistor and a first switching transistor of FIGS. 4 and 5.

FIG. 6 is a cross-sectional view illustrating an example of a driving transistor and a first switching transistor of FIGS. 4 and 5.

In FIG. 6, it is illustrated that each of the driving transistor DT and the first switching transistor ST1 is implemented as a TFT having a coplanar structure. The TFT having the coplanar structure has a top gate structure where a gate electrode is provided on an active layer.

Moreover, in FIG. 6, for convenience of description, only the first switching transistor ST1 of FIGS. 4 and 5 is illustrated. However, the second switching transistor ST2 of FIG. 4 and the second to fifth switching transistors STs ST2 to ST5 of FIG. 5 may be substantially implemented identically to the first switching transistor ST1 of FIG. 6.

Referring to FIG. 6, a driving transistor DT may include a bottom gate electrode 110, a first N-type semiconductor layer 130, a P-type semiconductor layer 140, a first gate electrode 160, a first source electrode 170, and a first drain electrode 180. A first switching transistor ST1 may include a second N-type semiconductor layer 230, a second gate electrode 260, a second source electrode 270, and a second drain electrode 280.

The driving transistor DT and the first switching transistor ST1 may be provided on the first substrate 1110. The first substrate 1110 may be formed of plastic, glass, and/or the like.

A buffer layer may be provided on the first substrate 1110, and the driving transistor DT and the first switching transistor ST1 may be provided on the first substrate 1110. The buffer layer may be a layer for protecting the driving transistor DT and the first switching transistor ST1 from moisture which can penetrate through the first substrate 1110. The buffer layer may include a plurality of inorganic layers which are alternately stacked. For example, the buffer layer may be formed of a multilayer where one or more of silicon oxide ($SiO_x$), silicon nitride ($SiN_x$), and silicon oxynitride (SiON) are alternately stacked.

The bottom gate electrode 110 may be provided on the first substrate 1110 or the buffer layer. The bottom gate electrode 110 may be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof.

A first gate insulation layer 120 may be provided on the bottom gate electrode 110. The first gate insulation layer 120 may be provided to cover the bottom gate electrode 110. The first gate insulation layer 120 may be formed of an inorganic layer, for example, $SiO_x$, $SiN_x$, or a multilayer thereof.

The first N-type semiconductor layer 130 and the second N-type semiconductor layer 230 may be provided on the first gate insulation layer 120. The P-type semiconductor layer 140 may be provided on the first N-type semiconductor layer 130.

The first N-type semiconductor layer 130 and the second N-type semiconductor layer 230 may be formed of an N-type oxide semiconductor layer. In this case, the first N-type semiconductor layer 130 and the second N-type semiconductor layer 230 may be formed of indium gallium zinc oxide (IGZO), indium zinc oxide (IZO), indium gallium oxide (IGO), indium tin zinc oxide (ITZO), gallium tin oxide (GTO), zinc tin oxide (ZTO), indium aluminum zinc oxide (IAZO), aluminum zinc oxide (AZO), indium tin oxide (ITO), aluminum tin oxide (ATO), or gallium zinc oxide (GZO).

The P-type semiconductor layer 140 may be formed of a P-type oxide semiconductor layer. In this case, the P-type semiconductor layer 140 may be formed of $Cu_2O$, SnO, NiO, $CuMO_2$ (delafossite, M=Al, Ga, In, Sr, Y, Sc, Cr), $ZnM_2O_4$ (spinel, M=Co, Rh, Ir), Ln/Cu/O/Ch (oxychalcogenide, Ln=lanthanoids (La to Lu), Ch=Se, S, Te), or Cu-nanowire.

If the first N-type semiconductor layer 130 is formed of an N-type oxide semiconductor layer and the P-type semiconductor layer 140 is formed of a P-type oxide semiconductor layer, a thickness of the P-type semiconductor layer 140 may be thinner than that of the first N-type semiconductor layer 130. For example, a thickness of the first N-type semiconductor layer 130 may be set to 30 nm or less, and a thickness of the P-type semiconductor layer 140 may be set to 10 nm or less. Also, the first and the second N-type semiconductor layer 230 are formed at the same time. Therefore, the thickness of the P-type semiconductor layer 140 may be set thinner than that of the second N-type semiconductor layer 230. A thickness of the P-type semiconductor layer 140 will be described below with reference to FIG. 8.

A second gate insulation layer 150 may be provided on the second N-type semiconductor layer 230 and the P-type semiconductor layer 140. The second gate insulation layer 150 may be formed of an inorganic layer, for example, $SiO_x$, $SiN_x$, or a multilayer thereof.

The first gate electrode 160 and the second gate electrode 260 may be provided on the second gate insulation layer 150. The first gate electrode 160 and the second gate electrode 260 may each be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof.

The second N-type semiconductor layer 230 and the P-type semiconductor layer 140 which are not covered by the second gate insulation layer 150 may become conductive. Therefore, a portion of the second N-type semiconductor layer 230 covered by the second gate insulation layer 150 may be defined as a second N-type channel area, and another portion of the second N-type semiconductor layer 230 uncovered by the second gate insulation layer 150 may be defined as a conductive area. Also, a portion of the P-type semiconductor layer 140 covered by the second gate insulation layer 150 may be defined as a P-type channel area, and another portion of the P-type semiconductor layer 140 uncovered by the second gate insulation layer 150 may be defined as a conductive area.

The first N-type semiconductor layer 130 may be covered by the P-type semiconductor layer 140, and thus, may not become conductive. Therefore, the first N-type semiconductor layer 130 disposed between the first source electrode 170 corresponding to a first contact hole CT1 and the first drain electrode 180 corresponding to a second contact hole CT2 may be defined as a first N channel area. Therefore, the bottom gate electrode 110 may be disposed to overlap the first source electrode 170 corresponding to the first contact hole CT1, the first drain electrode 180 corresponding to the second contact hole CT2, and the first N-type semiconductor layer 130 therebetween so as to activate the first N channel area.

An interlayer dielectric 190 may be provided on the second N-type semiconductor layer 230, the P-type semiconductor layer 140, the first gate electrode 160, and the second gate electrode 260. The interlayer dielectric 190 may be formed of an inorganic layer, for example, $SiO_x$, $SiN_x$, or a multilayer thereof.

The first contact hole CT1 and the second contact hole CT2 which expose the conductive area of the P-type semiconductor layer 140 may be provided in the interlayer dielectric 190 to pass through the interlayer dielectric 190. Also, a third contact hole CT3 and a fourth contact hole CT4 which expose the conductive area of the second N-type semiconductor layer 230 may be provided in the interlayer dielectric 190 to pass through the interlayer dielectric 190.

The first source electrode 170, the first drain electrode 180, the second source electrode 270, and the second drain electrode 280 may be provided on the interlayer dielectric 190. The first source electrode 170 may be connected to the conductive area of the P-type semiconductor layer 140 through the first contact hole CT1 in a first side of the P-type semiconductor layer 140. The first drain electrode 180 may be connected to the conductive area of the P-type semiconductor layer 140 through the second contact hole CT2 in a second side of the P-type semiconductor layer 140. The second source electrode 270 may be connected to the conductive area of the second N-type semiconductor layer 230 through the third contact hole CT3 in a first side of the second N-type semiconductor layer 230. The second drain electrode 280 may be connected to the conductive area of the second N-type semiconductor layer 230 through the fourth contact hole CT4 in a second side of the second N-type semiconductor layer 230.

The first source electrode 170, the first drain electrode 180, the second source electrode 270, and the second drain electrode 280 may each be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof.

As described above, in an aspect of the present disclosure, the driving transistor DT including the first N-type semiconductor layer 130 and the P-type semiconductor layer 140 provided on the first N-type semiconductor layer 130 may be provided. An area where the bottom gate electrode 110 disposed under the first N-type semiconductor layer 130 overlaps the first N-type semiconductor layer 130 may be defined as a first channel area having an N-type semiconductor characteristic, and an area where the first gate electrode 160 disposed on the P-type semiconductor layer 140 overlaps the P-type semiconductor layer 140 may be defined as a second channel area having a P-type semiconductor characteristic. In this case, when the gate signal is applied to the bottom gate electrode 110, a current may flow through the first channel area. Also, when the gate signal is applied to the first gate electrode 160, a current may flow through the second channel area. Therefore, in an aspect of the present disclosure, in a case where the P-type semiconductor characteristic is realized by using the second channel area, as in FIGS. 4 and 5, the driving transistor DT may be implemented as a P-type semiconductor layer. The N-type semiconductor characteristic realized by using the first channel area of the driving transistor DT and the P-type semiconductor characteristic realized by using the second channel area will be described below in detail with reference to FIG. 7.

Moreover, in an aspect of the present disclosure, a plurality of switching transistors which are provided in the coplanar structure and each include the second N-type semiconductor layer 230 may be provided. Therefore, in an aspect of the present disclosure, the switching transistors may be implemented in a top gate type, thereby solving a problem where driving stability is reduced by a parasitic capacitance generated between a bottom gate electrode and a source electrode or a drain electrode in a bottom gate structure.

Figure 7:
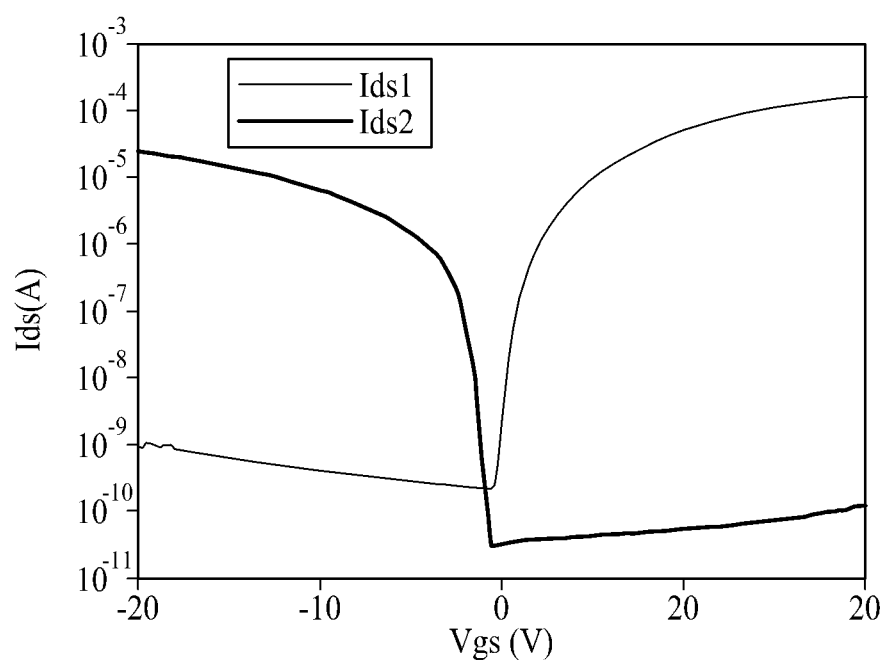
FIG. 7 is a graph showing an N-type semiconductor characteristic and a P-type semiconductor characteristic of a driving transistor.

FIG. 7 is a graph showing an N-type semiconductor characteristic and a P-type semiconductor characteristic of a driving transistor, respectively.

In FIG. 7, if the first N-type semiconductor layer 130 of the driving transistor is formed of IGZO and the P-type semiconductor layer 140 is formed of $CuO_2$, a current value Ids1 of a first channel area based on a gate-source voltage Vgs and a current value Ids2 of a second channel area are shown. Also, in FIG. 7, an experiment has been done under a condition where a channel width W1 of the first channel area of the driving transistor is set to be 980 μm, a channel length L1 of the first channel area is set to be 150 μm, a channel width W2 of the second channel area is set to 1,960

µm, and a channel length L2 of the second channel area is set to be 960 µm. In FIG. 7, the X axis represents a gate-source voltage Vgs, and the Y axis represents a current value Ids of a channel area.

Referring to FIG. 7, the first channel area CH1 corresponds to an N channel area, and thus, if the gate-source voltage Vgs has a positive voltage, the N-type semiconductor characteristic where the current value Ids1 of the first channel area CH1 increases in proportion to the gate-source voltage Vgs is shown.

Moreover, the second channel area CH2 corresponds to a P channel area, and thus, if the gate-source voltage Vgs has a negative voltage, the P-type semiconductor characteristic where the current value Ids2 of the second channel area CH2 increases in proportion to the gate-source voltage Vgs is shown.

As described above, in the driving transistor DT, an area where the bottom gate electrode 110 overlaps the first N-type semiconductor layer 130 may be provided as a first channel area between the first source electrode 170 and the first drain electrode 180, and an area where the first gate electrode 160 overlaps the P-type semiconductor layer 140 may be provided as a second channel area between the second source electrode 270 and the second drain electrode 280. As a result, in an aspect of the present disclosure, the first channel area CH1 may be implemented to have the N-type semiconductor characteristic, and the second channel area CH2 may be implemented to have the P-type semiconductor characteristic. That is, in an aspect of the present disclosure, since the first N-type semiconductor layer 130 and the P-type semiconductor layer 140 are all provided, the first channel area which is implemented by the first N-type semiconductor layer 130 and has the N-type semiconductor characteristic and the second channel area which is implemented by the P-type semiconductor layer 140 and has the P-type semiconductor characteristic may all be used.

In a case where the driving transistor DT is driven with the P-type semiconductor characteristic by using the P-type semiconductor layer 140, when a source voltage of the first source electrode 170 or a drain voltage of the first drain electrode 180 has a negative polarity, the first N-type semiconductor layer 130 may be deactivated. Also, in a case where the driving transistor DT is driven with the N-type semiconductor characteristic by using the N-type semiconductor layer 130, when the source voltage of the first source electrode 170 or the drain voltage of the first drain electrode 180 has a positive polarity, the P-type semiconductor layer 140 may be deactivated. However, it is difficult to control the source voltage and the drain voltage to different polarities.

Therefore, in a case where the driving transistor DT is driven with the P-type semiconductor characteristic by using the P-type semiconductor layer 140, the source voltage of the first source electrode 170 and the drain voltage of the first drain electrode 180 have a positive polarity, and thus, a bias voltage should be applied to the bottom gate electrode 110 so as to deactivate the first N-type semiconductor layer 130. However, when the bias voltage is applied to the bottom gate electrode 110, the first drain electrode 180 and the first source electrode 170 overlapping the bottom gate electrode 110 can be affected by a parasitic capacitance.

In an aspect of the present disclosure, when the driving transistor DT is driven with the P-type semiconductor characteristic by using the P-type semiconductor layer 140, the source voltage of the first source electrode 170 and the drain voltage of the first drain electrode 180 have a positive polarity, and thus, as shown in Equation (1), a threshold voltage of the first N-type semiconductor layer 130 may be set greater than half of a drain voltage applied to the first drain electrode 180, thereby the first N-type semiconductor layer 130 may be deactivated even without applying the bias voltage to the bottom gate electrode 110:

$$Vth_{N1} > \frac{DV}{2} \quad (1)$$

where $Vth_{N1}$ denotes a threshold voltage of the first N-type semiconductor layer 130, and DV denotes a drain voltage applied to the first drain electrode 180. In FIGS. 4 and 5, a drain voltage applied to the drain electrode of the driving transistor DT may be the second source voltage of the second source voltage line VDDL.

A threshold voltage $Vth_{N1}$ of a first channel area may be set by adjusting a content of oxygen of the first N-type semiconductor layer 130. For example, if a content of oxygen of the first N-type semiconductor layer 130 increases, the threshold voltage $Vth_{N1}$ of the first N-type semiconductor layer 130 may increase. Also, if a content of oxygen of the first N-type semiconductor layer 130 decreases, the threshold voltage $Vth_{N1}$ of the first N-type semiconductor layer 130 may decrease.

As described above, in an aspect of the present disclosure, as in Equation (1), the threshold voltage of the first N-type semiconductor layer 130 may be set greater than half of the drain voltage applied to the first drain electrode 180, thereby the first N-type semiconductor layer 130 may be deactivated even without applying the bias voltage to the bottom gate electrode 110. Therefore, in an aspect of the present disclosure, a driving stability of the driving transistor DT is enhanced even without the first source electrode 170 being connected to the bottom gate electrode 110 of the driving transistor DT.

Figure 1B:
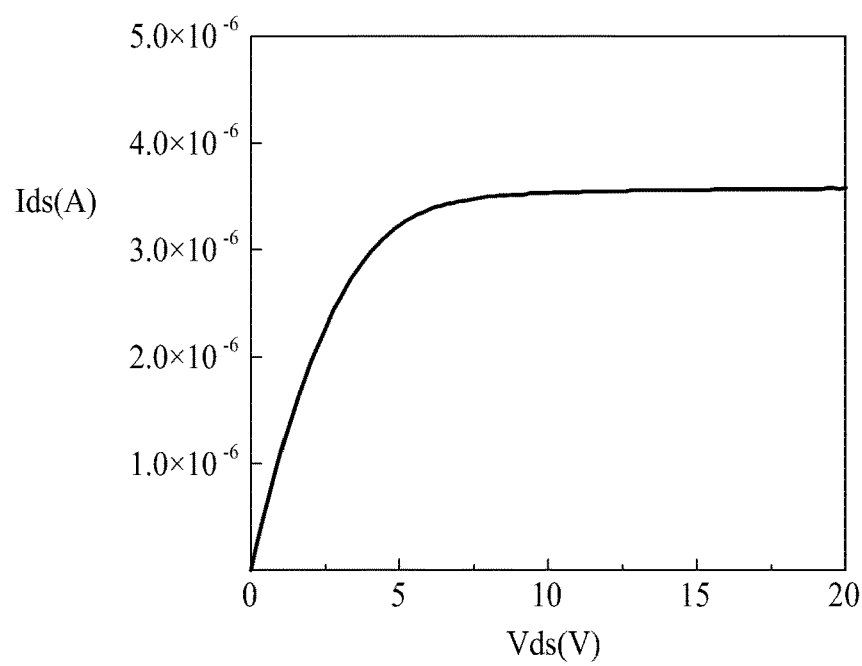

Moreover, in an aspect of the present disclosure, the first N-type semiconductor layer 130 may be deactivated even without applying the bias voltage to the bottom gate electrode 110, and thus, in order for any voltage not to be applied to the bottom gate electrode 110, the bottom gate electrode 110 may be floated or omitted. That is, in an aspect of the present disclosure, even when the bottom gate electrode 110 is floated or omitted, as in FIG. 1B, the constant drain-source current Ids of the driving transistor can be maintained in the drain-source voltage Vds or higher, and thus, a driving stability of the driving transistor can be enhanced.

Figure 8:
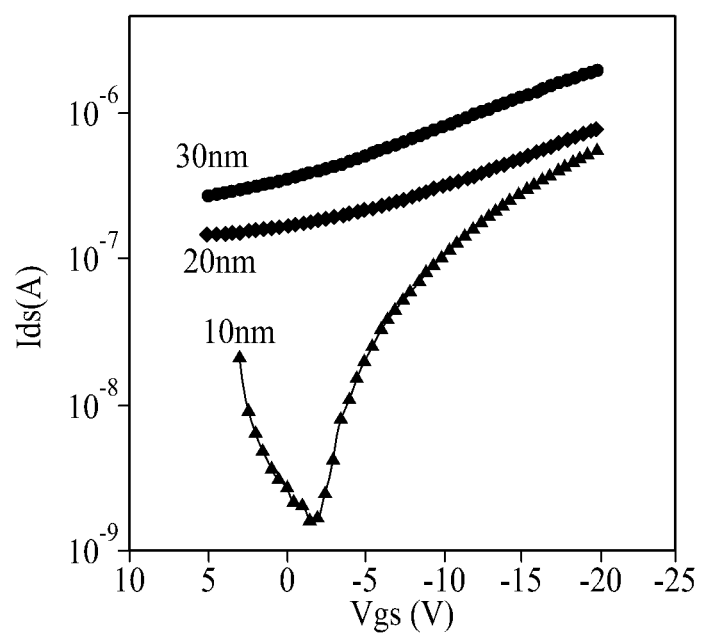
FIG. 8 is a graph showing a P-type semiconductor characteristic with respect to a thickness of a P-type semiconductor layer of a driving transistor.

FIG. 8 is a graph showing a P-type semiconductor characteristic with respect to a thickness of a P-type semiconductor layer of a driving transistor.

In FIG. 8, in a case where the first N-type semiconductor layer 130 is formed of $Al_2O_3$, the P-type semiconductor layer 140 is formed of $Cu_2O$, and a drain-source voltage is set to be −20V, when a thickness of the P-type semiconductor layer 140 is 10 nm, 20 nm, and 30 nm, a current value Ids2 of a second channel area based on a gate-source voltage Vgs is shown. Also, in FIG. 8, a thickness of the first N-type semiconductor layer 130 is set to be 30 nm. In FIG. 8, the X axis represents the gate-source voltage Vgs, and the Y axis represents a current value Ids of the second channel area.

Referring to FIG. 8, when a thickness of the P-type semiconductor layer 140 is 20 nm or 30 nm, a current continuously flows despite a variation of a gate-source voltage Vgs, and for this reason, the P-type semiconductor characteristic is not normally realized. That is, when a thickness of the P-type semiconductor layer 140 is 20 nm or 30 nm, the P-type semiconductor layer 140 cannot have the P-type semiconductor characteristic.

On the other hand, when a thickness of the P-type semiconductor layer 140 is 10 nm, an off current characteristic appears in the gate-source voltage Vgs close to 0 V, and thus, the P-type semiconductor characteristic is realized. That is, when a thickness of the P-type semiconductor layer 140 is 10 nm, the P-type semiconductor characteristic is realized.

As described above, in the TFT 10 according to an aspect of the present disclosure, when a thickness of the P-type semiconductor layer 140 is set to be 10 nm or less, the P-type semiconductor characteristic is realized. Therefore, a thickness of the P-type semiconductor layer 140 may be set thinner than that of the first N-type semiconductor layer 130.

FIG. 9 is a flowchart illustrating a method of manufacturing a driving transistor and a first switching transistor according to an aspect of the present disclosure. FIGS. 10A to 10F are cross-sectional views illustrating a method of manufacturing a driving transistor and a first switching transistor according to an aspect of the present disclosure.

The cross-sectional views of FIGS. 10A to 10F are views for describing a method of manufacturing the driving transistor DT and the first switching transistor ST1 illustrated in FIG. 6, and thus, the same reference numerals refer to the same elements. Hereinafter, a method of manufacturing a driving transistor and a first switching transistor according to an aspect of the present disclosure will be described with reference to FIG. 9 and FIGS. 10A to 10F.

Figure 10A:
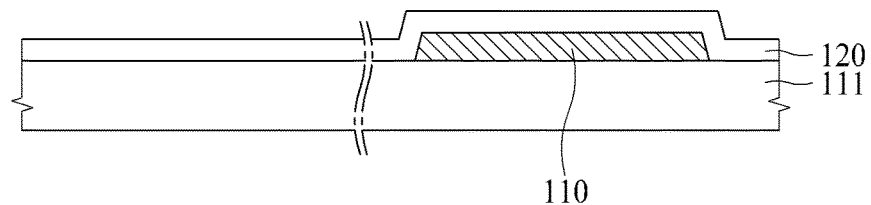
FIGS. 10A to 10F are cross-sectional views illustrating a method of manufacturing a driving transistor and a first switching transistor according to an aspect of the present disclosure.

First, as in FIG. 10A, a bottom gate electrode 110 may be formed on the first substrate 1110, and a first gate insulation layer 120 may be formed on the bottom gate electrode 110.

A buffer layer may be formed on the first substrate 1110. The buffer layer may be a layer for protecting the driving transistor DT and the first switching transistor ST1 from moisture which can penetrate through the first substrate 1110. The buffer layer may include a plurality of inorganic layers which are alternately stacked. For example, the buffer layer may be formed of a multilayer where one or more of silicon oxide ($SiO_x$), silicon nitride ($SiN_x$), and silicon oxynitride (SiON) are alternately stacked. The buffer layer may be formed by a plasma enhanced chemical vapor deposition (PECVD) process. The buffer layer may be omitted.

The bottom gate electrode 110 may be formed on the first substrate 1110 or the buffer layer. In detail, a first metal layer may be formed on the front surface of the first substrate 1110 or the buffer layer by using a sputtering process or a metal organic chemical vapor deposition (MOCVD) process. Subsequently, a photoresist pattern may be formed on the first metal layer, and then, the bottom gate electrode 110 may be formed by patterning the first metal layer through a mask process of etching the first metal layer. The bottom gate electrode 110 may be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof.

Subsequently, a first gate insulation layer 120 may be formed on the bottom gate electrode 110. The first gate insulation layer 120 may be formed to cover the bottom gate electrode 110. The first gate insulation layer 120 may be formed of an inorganic layer, for example, $SiO_x$, $SiN_x$, or a multilayer thereof. The first gate insulation layer 120 may be formed through a PECVD process. (S101 of FIG. 9)

Figure 10B:
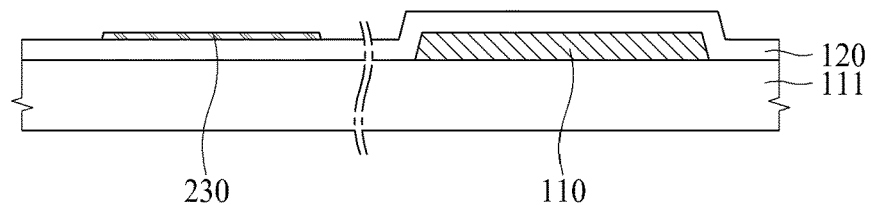

Second, as in FIG. 10B, a second N-type semiconductor layer 230 of the first switching transistor ST1 may be formed on the first gate insulation layer 120.

In detail, a first semiconductor layer may be formed on the front surface of the first gate insulation layer 120 by using a sputtering process or an MOCVD process. Subsequently, the second N-type semiconductor layer 230 of the first switching transistor ST1 may be formed by patterning the first semiconductor layer through a mask process using the photoresist pattern.

The second N-type semiconductor layer 230 may each be formed of an N-type oxide semiconductor layer. In this case, the second N-type semiconductor layer 230 may be formed of IGZO, IZO, IGO, ITZO, GTO, ZTO, IAZO, AZO, ITO, ATO, or GZO.

Hereinafter, an example where a P-type semiconductor layer 132 is formed of $Cu_2O$ will be described.

In a case where the P-type semiconductor layer 132 is formed of $Cu_2O$, in order for the driving transistor DT to have all of the N-type semiconductor characteristic and the P-type semiconductor characteristic, the first N-type semiconductor layer 130 and the P-type semiconductor layer 140 should be formed while maintaining a vacuum state. That is, the first N-type semiconductor layer 130 and the P-type semiconductor layer 140 may be successively deposited in one chamber while maintaining a vacuum state. In forming the first N-type semiconductor layer 130 and the P-type semiconductor layer 140, a vacuum condition of 5 mTorr to 10 mTorr may be maintained.

If a vacuum state is not maintained in forming the first N-type semiconductor layer 130 and the P-type semiconductor layer 140, the first N-type semiconductor layer 130 can be oxidized by oxygen in the atmosphere. For this reason, an interface of the first N-type semiconductor layer 130 and the P-type semiconductor layer 140 can be unstable.

Moreover, the P-type semiconductor layer 140 may be formed under a condition where an oxygen partial pressure is 3% or less. When the oxygen partial pressure is higher than 3%, the P-type semiconductor layer 140 may be formed of CuO without being formed of $Cu_2O$. Also, if a vacuum state is not maintained in forming the first N-type semiconductor layer 130 and the P-type semiconductor layer 140, the P-type semiconductor layer 140 may be formed of CuO without being formed of $Cu_2O$, due to the oxygen in the atmosphere.

Figure 11:
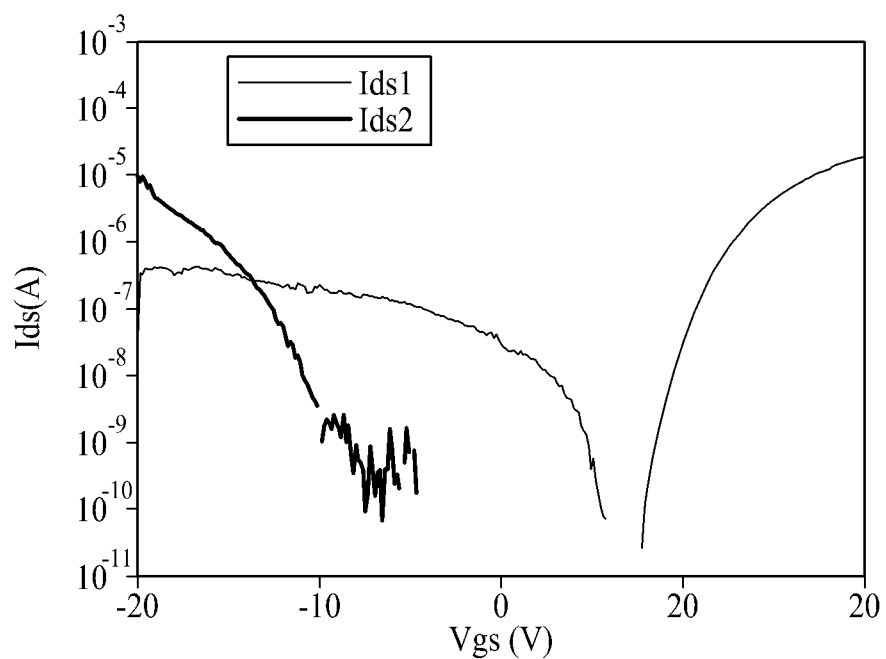
FIG. 11 is a graph showing an N-type semiconductor characteristic and a P-type semiconductor characteristic of a thin film transistor when continuously forming an N-type semiconductor layer and a P-type semiconductor layer in a vacuum chamber without breaking vacuum.

Electron mobility is more reduced in a case, where the P-type semiconductor layer 140 is formed of CuO, than a case where the P-type semiconductor layer 140 is formed of $Cu_2O$. That is, if the P-type semiconductor layer 140 is formed of CuO, an electron mobility of a second channel area CH2 can be as low as 1 $cm^2$/Vs. In this case, as in FIG. 11, the P-type semiconductor characteristic of the P-type semiconductor layer 140 of the driving transistor DT is reduced, and for this reason, the driving transistor DT is difficult to have the P-type semiconductor characteristic.

Moreover, thermal treatment may be performed at a high temperature so as to change the P-type semiconductor layer 140 including CuO to the P-type semiconductor layer 140 including $Cu_2O$. For example, a thermal treatment may be performed on the P-type semiconductor layer 140 including CuO for thirty or more minutes at a high temperature of 300 degrees or higher under a vacuum condition. However, in a case where a thermal treatment is performed at a high temperature under a vacuum condition, even when oxygen is desorbed from the first N-type semiconductor layer 130, a conductivity of the first N-type semiconductor layer 130 increases, and for this reason, as in FIG. 11, an off current increases.

As described above, in a case where the P-type semiconductor layer 140 is formed by using $Cu_2O$ as a target, an oxygen partial pressure may be 0% to 30%. However, in a case where the P-type semiconductor layer 140 is formed through $O_2$ reaction by using Cu as a target, an oxygen partial pressure may be 40%.

When the P-type semiconductor layer 132 is formed to have a thickness of 10 nm or less as in FIG. 8, the P-type semiconductor layer 132 may have the P-type semiconductor characteristic, and moreover, it is easy for the P-type semiconductor layer 140 to be formed of $Cu_2O$. Therefore, a thickness of the P-type semiconductor layer 140 may be 10 nm or less. (S102 of FIG. 9)

Figure 10C:
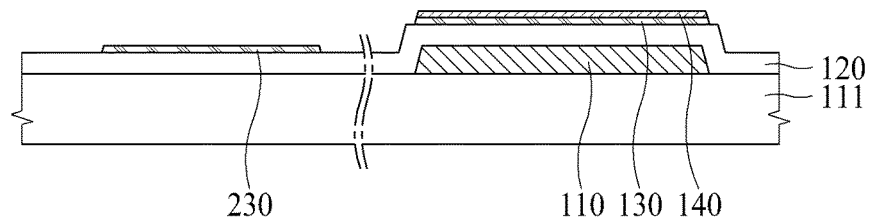

Third, as in FIG. 10C, the first N-type semiconductor layer 130 and the P-type semiconductor layer 140 of the driving transistor DT may be formed on the first gate insulation layer 120.

In detail, a second semiconductor layer may be formed on the front surface of the first gate insulation layer 120 through a sputtering process or an MOCVD process. Also, a third semiconductor layer may be formed on the front surface of the second semiconductor layer through a sputtering process or an MOCVD process. Subsequently, the N-type semiconductor layer 130 and the P-type semiconductor layer 140 of the driving transistor DT may be formed by simultaneously patterning the second semiconductor layer and the third semiconductor layer through a mask process using a photoresist pattern.

The first N-type semiconductor layer 130 may be formed of an N-type oxide semiconductor layer, and the P-type semiconductor layer 140 may be of a P-type oxide semiconductor layer. In this case, the first N-type semiconductor layer 130 may be formed of IGZO, IZO, IGO, ITZO, GTO, ZTO, IAZO, AZO, ITO, ATO, or GZO, and the P-type semiconductor layer 140 may be formed of $Cu_2O$, SnO, NiO, $CuMO_2$ (delafossite, M=Al, Ga, In, Sr, Y, Sc, Cr), $ZnM_2O_4$ (spinel, M=Co, Rh, Ir), Ln/Cu/O/Ch (oxychalcogenide, Ln=lanthanoids (La to Lu), Ch=Se, S, Te), or Cu-nanowire. (S103 of FIG. 9)

Figure 10D:
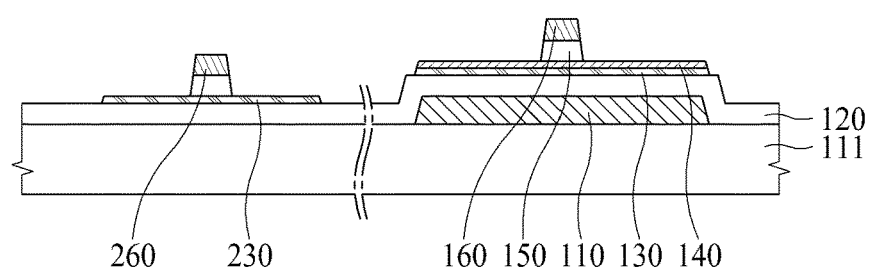
Figure 10E:
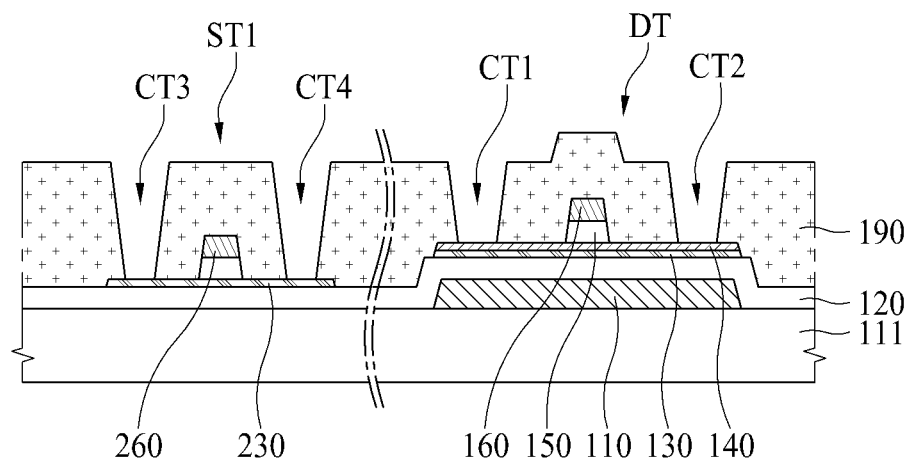
Figure 10F:
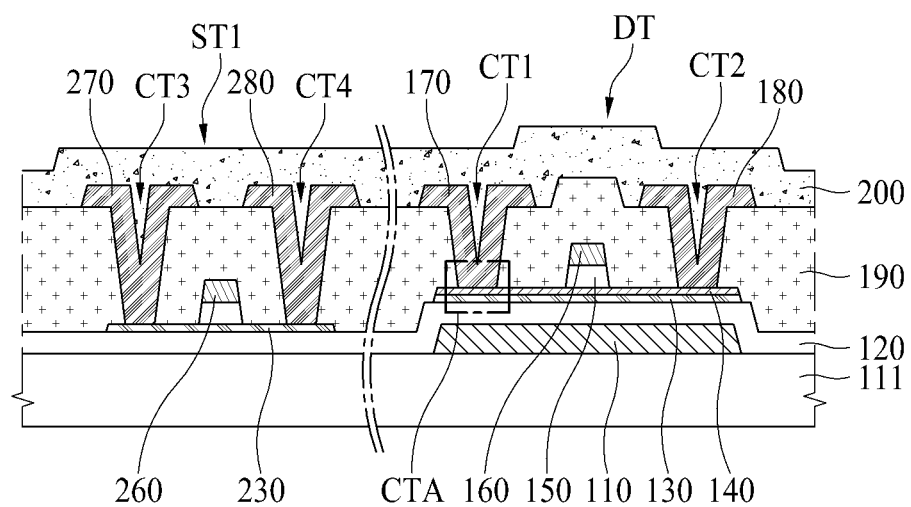

Fourth, as in FIG. 10D, a second gate insulation layer 150 may be formed on the second N-type semiconductor layer 230 and the P-type semiconductor layer 140, and a first gate electrode 160 and a second gate electrode 260 may be formed on the second gate insulation layer 150.

In detail, a gate insulation layer 120 and a second metal layer may be formed on a front surface of each of the second N-type semiconductor layer 230 and the P-type semiconductor layer 140. The gate insulation layer 120 may be formed through a PECVD process. The second metal layer may be formed through a sputtering process or an MOCVD process. Subsequently, a photoresist pattern may be formed on the second metal layer, and then, the second gate insulation layer 150, the first gate electrode 160, and the second gate electrode 260 may be formed by simultaneously patterning the second metal layer and the second gate insulation layer through a mask process of etching both the second metal layer and the second gate insulation.

An upper surface of the second N-type semiconductor layer 230 and an upper surface of the P-type semiconductor layer 140, which are not covered by the second gate insulation layer 150, may become conductive through an etching process.

The second gate insulation layer 150 may be formed of an inorganic layer, for example, $SiO_x$, $SiN_x$, or a multilayer thereof. The first gate electrode 160 and the second gate electrode 260 may each be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof. (S104 of FIG. 9)

Fifth, an interlayer dielectric 190 may be formed on the second N-type semiconductor layer 230, the P-type semiconductor layer 140, the first gate electrode 160, and the second gate electrode 260, and the first to fourth contact holes CT1 to CT4 may be formed in the interlayer dielectric 190. (S105 of FIG. 9)

In detail, the interlayer dielectric 190 may be formed on the second N-type semiconductor layer 230, the P-type semiconductor layer 140, the first gate electrode 160, and the second gate electrode 260. The interlayer dielectric 190 may be formed of an inorganic layer, for example, $SiO_x$, $SiN_x$, or a multilayer thereof. The interlayer dielectric 190 may be formed through a PECVD process.

Subsequently, the first and second contact holes CT1 and CT2 which each expose a portion of the P-type semiconductor layer 140 to pass through the interlayer dielectric 190 and the third and fourth contact holes CT3 and CT4 each exposing a portion of the second N-type semiconductor layer 230 may be formed.

Sixth, a first source electrode 170, a first drain electrode 180, a second source electrode 270, and a second drain electrode 280 may be formed on the interlayer dielectric 190.

In detail, a third metal layer may be formed on the interlayer dielectric 190 through a sputtering process or an MOCVD process. Subsequently, the first source electrode 170, the first drain electrode 180, the second source electrode 270, and the second drain electrode 280 may be formed by patterning the third metal layer through a mask process using a photoresist pattern.

The first source electrode 170 may be connected to a conductive area 141 of the P-type semiconductor layer 140 through the first contact hole CT1 in a first side of the P-type semiconductor layer 140. The first drain electrode 180 may be connected to the conductive area 141 of the P-type semiconductor layer 140 through the second contact hole CT2 in a second side of the P-type semiconductor layer 140.

The second source electrode 270 may be connected to a conductive area 231 of the second N-type semiconductor layer 230 through the third contact hole CT3 in a first side of the second N-type semiconductor layer 230. The second drain electrode 280 may be connected to the conductive area 231 of the second N-type semiconductor layer 230 through the fourth contact hole CT4 in a second side of the second N-type semiconductor layer 230.

The first source electrode 170, the first drain electrode 180, the second source electrode 270, and the second drain electrode 280 may each be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof.

A passivation layer 300 may be formed on the first source electrode 170, the first drain electrode 180, the second source electrode 270, and the second drain electrode 280. (S106 of FIG. 9)

As described above, in an aspect of the present disclosure, the first N-type semiconductor layer 130 and the P-type semiconductor layer 140 may be successively deposited in one chamber while maintaining a vacuum state. As a result, in an aspect of the present disclosure, an interface of the first N-type semiconductor layer 130 and the P-type semiconductor layer 140 may be stably formed, and moreover, the P-type semiconductor layer 140 may be formed of $Cu_2O$ instead of CuO. Accordingly, in an aspect of the present disclosure, a driving transistor having all of the N-type semiconductor characteristic and the P-type semiconductor characteristic may be formed.

Figure 12A:
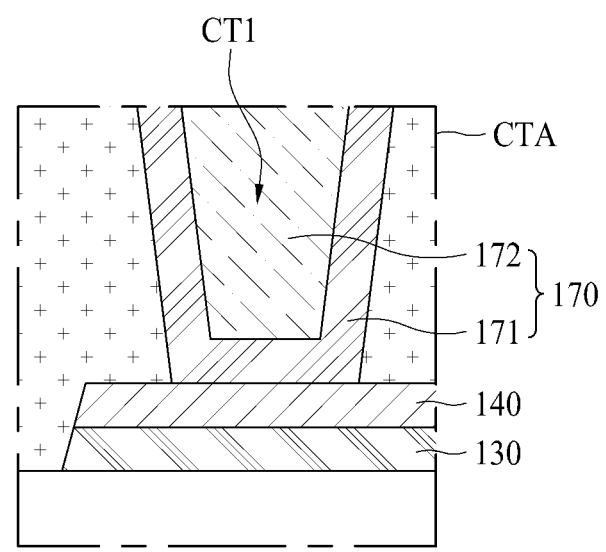
FIGS. 12A to 12C are cross-sectional views illustrating in detail a source contact area of the driving transistor of FIG. 6.
Figure 12B:
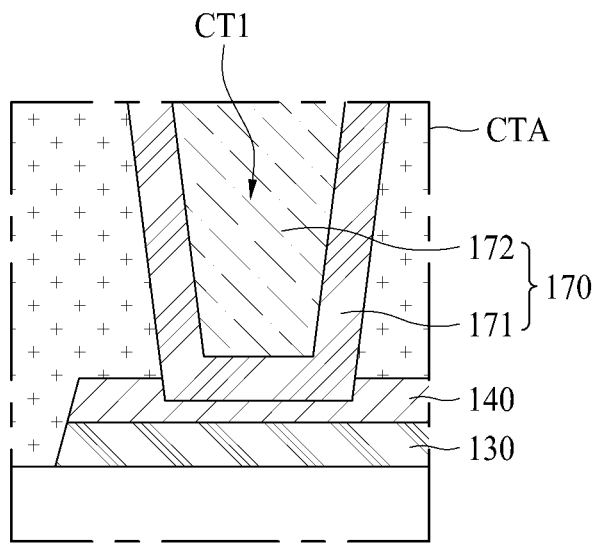
Figure 12C:
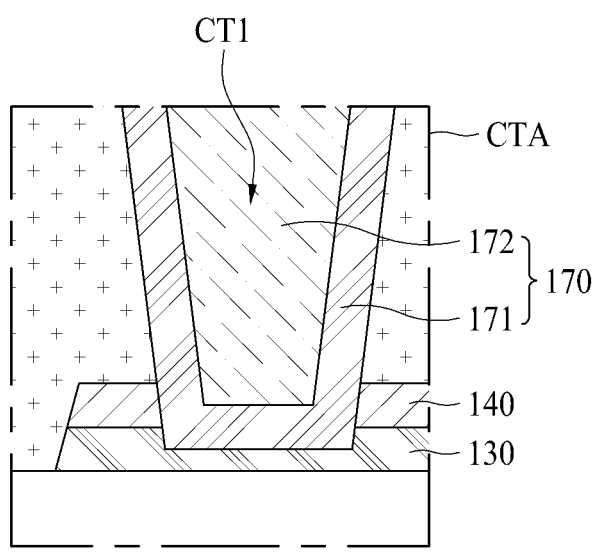

FIGS. 12A to 12C are cross-sectional views illustrating in detail a source contact area of the driving transistor of FIG. 6.

In FIGS. 12A to 12C, a source contact area CTA which is an area where the first source electrode 170 of the driving transistor DT is connected to the P-type semiconductor layer 140 may be provided.

In a case where the first contact hole CT1 is formed to pass through the interlayer dielectric 190, as in FIG. 12A, the P-type semiconductor layer 140 may not be etched. In this case, the first source electrode 170 may be connected to an upper surface of the P-type semiconductor layer 140 through the first contact hole CT1.

However, in a case where the first contact hole CT1 is formed to pass through the interlayer dielectric 190, as in FIG. 12B, a portion of the P-type semiconductor layer 140 may be etched. In this case, the first source electrode 170 may be connected to an etched surface of the P-type semiconductor layer 140 through the first contact hole CT1.

Moreover, in a case where the first contact hole CT1 is formed to pass through the interlayer dielectric 190, as in FIG. 12B, a whole portion of the P-type semiconductor layer 140 may be etched. In this case, the first source electrode 170 may be connected to the first N-type semiconductor layer 130 through the first contact hole CT1. Also, the first source electrode 170 may be connected to only a side surface of the P-type semiconductor layer 140 exposed through the first contact hole CT1. In this case, the P-type semiconductor characteristic is reduced due to a defective contact with the P-type semiconductor layer 140.

In order to solve such a problem, the first source electrode 170 may include a first source electrode layer 171 and a second source electrode layer 172, and the first source electrode layer 171 may be formed of a P-type semiconductor material. For example, the first source electrode layer 171 may be formed of the P-type semiconductor material, and for example, may be formed of $Cu_2O$, SnO, NiO, $CuMO_2$ (delafossite, M=Al, Ga, In, Sr, Y, Sc, Cr), $ZnM_2O_4$ (spinel, M=Co, Rh, Ir), Ln/Cu/O/Ch (oxychalcogenide, Ln=lanthanoids (La to Lu), Ch=Se, S, Te), or Cu-nanowire. The first source electrode layer 171 may be formed of the same material as that of the P-type semiconductor layer 140. The second source electrode layer 172 may be formed of a single layer or a multilayer including one of molybdenum (Mo), aluminum (Al), chromium (Cr), gold (Au), titanium (Ti), nickel (Ni), neodymium (Nd), and copper (Cu) or an alloy thereof.

As described above, in an aspect of the present disclosure, the first source electrode 170 may be formed to include the first source electrode layer 171 including a P-type semiconductor material and the second source electrode layer 172 formed on the first source electrode layer 171. Therefore, in an aspect of the present disclosure, even when a whole portion of the P-type semiconductor layer 140 is etched in a process of forming the first contact hole CT1, the first source electrode layer 171 including the P-type semiconductor material may be connected to the P-type semiconductor layer 140, thereby solving a problem where the P-type semiconductor characteristic is reduced due to a defective contact with the P-type semiconductor layer 140.

Moreover, the first drain electrode 170 of the driving transistor DT may include a first drain electrode layer and a second drain electrode layer. The first drain electrode layer and the second drain electrode layer may be substantially the same as the first source electrode layer 171 and the second source electrode layer 172 described above with reference to FIGS. 12A to 12C, and thus, their detailed descriptions are omitted.

Figure 13:
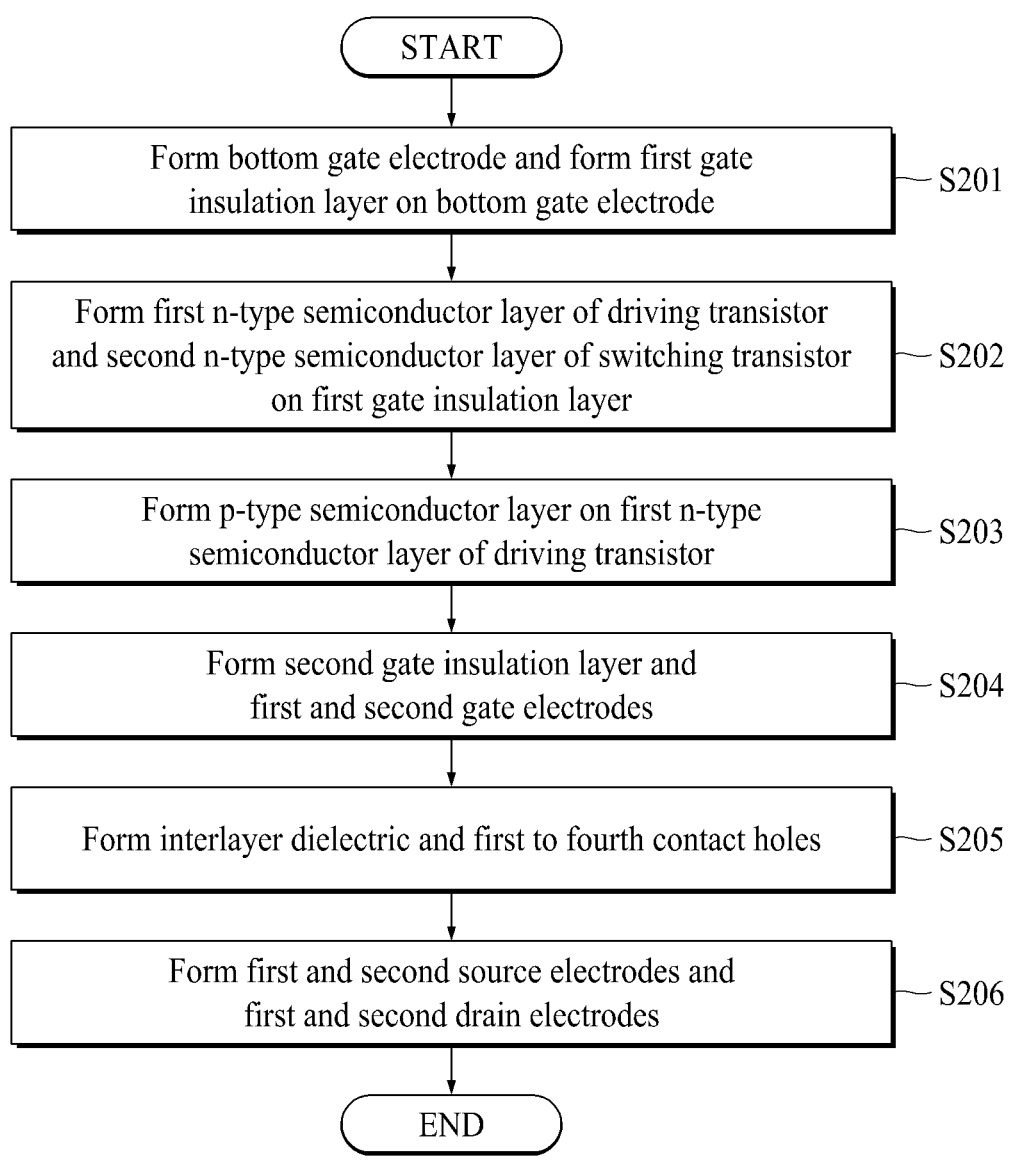
FIG. 13 is a flowchart illustrating a method of manufacturing a driving transistor and a first switching transistor according to another aspect of the present disclosure.
Figure 14A:
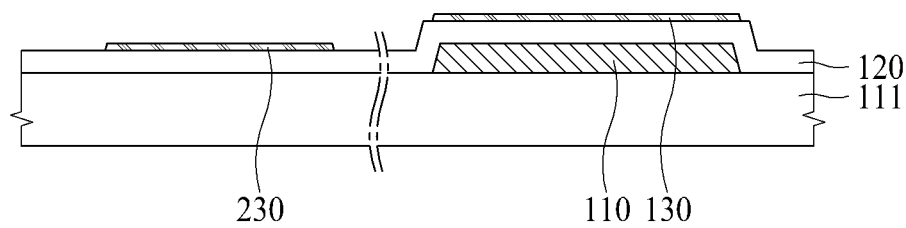
FIGS. 14A and 14B are cross-sectional views illustrating a method of manufacturing a driving transistor and a first switching transistor according to another aspect of the present disclosure.
Figure 14B:
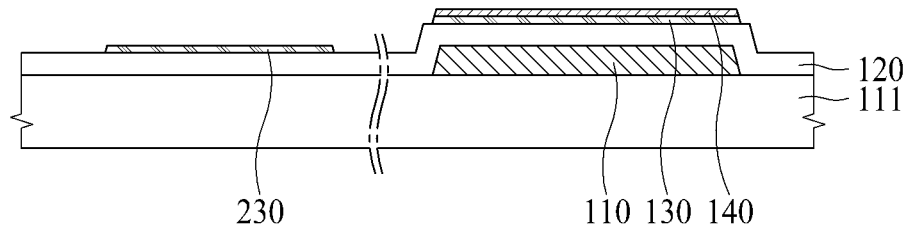

FIG. 13 is a flowchart illustrating a method of manufacturing a driving transistor and a first switching transistor according to another aspect of the present disclosure. FIGS. 14A and 14B are cross-sectional views illustrating a method of manufacturing a driving transistor and a first switching transistor according to another aspect of the present disclosure.

The cross-sectional views of FIGS. 14A and 14B are views for describing a method of manufacturing the driving transistor DT and the first switching transistor ST1 illustrated in FIG. 6, and thus, the same reference numerals refer to the same elements. Hereinafter, a method of manufacturing a driving transistor and a first switching transistor according to an aspect of the present disclosure will be described with reference to FIG. 13 and FIGS. 14A and 14B.

First, a bottom gate electrode 110 may be formed on the first substrate 1110, and a first gate insulation layer 120 may be formed on the bottom gate electrode 110.

A step (S201) of FIG. 13 is substantially the same as a step (S101) described above with reference to FIG. 10A. Thus, a description of a step (S201) of FIG. 13 is omitted. (S301 of FIG. 16)

Second, as in FIG. 14A, a first N-type semiconductor layer 130 of a driving transistor DT and a second N-type semiconductor layer 230 of a first switching transistor ST1 may be formed on the first gate insulation layer 120.

In detail, a first semiconductor layer may be formed on a front surface of the first gate insulation layer 120 through a sputtering process or an MOCVD process. Subsequently, the first N-type semiconductor layer 130 of the driving transistor DT and the second N-type semiconductor layer 230 of the first switching transistor ST1 may be formed by patterning the first semiconductor layer through a mask process using a photoresist pattern.

The first N-type semiconductor layer 130 and the second N-type semiconductor layer 230 may each be formed of an N-type oxide semiconductor layer. In this case, the second N-type semiconductor layer 230 may be formed of IGZO, IZO, IGO, ITZO, GTO, ZTO, IAZO, AZO, ITO, ATO, or GZO. (S202 of FIG. 13)

Third, as in FIG. 14B, the first N-type semiconductor layer 130 of the driving transistor DT may be formed on the P-type semiconductor layer 140.

In detail, a second semiconductor layer may be formed on the first gate insulation layer 120, the first N-type semiconductor layer 130, and the second N-type semiconductor layer 230 through a sputtering process or an MOCVD process. Subsequently, the P-type semiconductor layer 140 of the driving transistor DT may be formed by patterning the second semiconductor layer through a mask process using a photoresist pattern.

The P-type semiconductor layer 140 may be of a P-type oxide semiconductor layer. In this case, the P-type semiconductor layer 140 may be formed of $Cu_2O$, SnO, NiO, $CuMO_2$ (delafossite, M=Al, Ga, In, Sr, Y, Sc, Cr), $ZnM_2O_4$ (spinel, M=Co, Rh, Ir), Ln/Cu/O/Ch (oxychalcogenide, Ln=lanthanoids (La to Lu), Ch=Se, S, Te), or Cu-nanowire.

Hereinafter, an example where a P-type semiconductor layer 132 is formed of $Cu_2O$ will be described.

In a case where the P-type semiconductor layer 132 is formed of $Cu_2O$, in order for the driving transistor DT to have all of the N-type semiconductor characteristic and the P-type semiconductor characteristic, the first N-type semiconductor layer 130 and the P-type semiconductor layer 140 should be formed while maintaining a vacuum state. That is, the first N-type semiconductor layer 130 and the P-type semiconductor layer 140 may be successively deposited in one chamber while maintaining a vacuum state. In forming the first N-type semiconductor layer 130 and the P-type semiconductor layer 140, a vacuum condition of 5 mTorr to 10 mTorr may be maintained.

If a vacuum state is not maintained in forming the first N-type semiconductor layer 130 and the P-type semiconductor layer 140, the first N-type semiconductor layer 130 can be oxidized by the oxygen in the atmosphere. For this reason, an interface of the first N-type semiconductor layer 130 and the P-type semiconductor layer 140 can be unstable.

Moreover, the P-type semiconductor layer 140 may be formed under a condition where an oxygen partial pressure is 3% or less. When the oxygen partial pressure is higher than 3%, the P-type semiconductor layer 140 may be formed of CuO without being formed of $Cu_2O$. Also, if a vacuum state is not maintained in forming the first N-type semiconductor layer 130 and the P-type semiconductor layer 140, the P-type semiconductor layer 140 may be formed of CuO without being formed of $Cu_2O$, due to oxygen of the atmosphere.

Electron mobility is more reduced in a case, where the P-type semiconductor layer 140 is formed of CuO, than a case where the P-type semiconductor layer 140 is formed of $Cu_2O$. That is, if the P-type semiconductor layer 140 is formed of CuO, an electron mobility of a second channel area CH2 becomes as low as 1 $cm^2/Vs$. In this case, as in FIG. 11, the P-type semiconductor characteristic of the P-type semiconductor layer 140 of the driving transistor DT is reduced, and for this reason, the driving transistor DT is difficult to have the P-type semiconductor characteristic.

Moreover, thermal treatment may be performed at a high temperature so as to change the P-type semiconductor layer 140 including CuO to the P-type semiconductor layer 140 including $Cu_2O$. For example, thermal treatment may be performed on the P-type semiconductor layer 140 including CuO for thirty or more minutes at a high temperature of 300 degrees or more in a vacuum state. However, in a case where thermal treatment is performed at a high temperature in a vacuum state, even when oxygen is desorbed from the first N-type semiconductor layer 130, a conductivity of the first N-type semiconductor layer 130 increases, and for this reason, as in FIG. 11, an off current increases.

As described above, in a case where the P-type semiconductor layer 140 is formed by using $Cu_2O$ as a target, an oxygen partial pressure may be 0% to 30%. However, in a case where the P-type semiconductor layer 140 is formed through $O_2$ reaction by using Cu as a target, an oxygen partial pressure may be 40%.

When the P-type semiconductor layer 132 is formed to have a thickness of 10 nm or less as in FIG. 8, the P-type semiconductor layer 132 may have the P-type semiconductor characteristic, and moreover, it is easy for the P-type semiconductor layer 140 to be formed of $Cu_2O$. Therefore, a thickness of the P-type semiconductor layer 140 may be 10 nm or less. (S203 of FIG. 13)

Fourth, as in FIG. 10D, a second gate insulation layer 150 may be formed on the second N-type semiconductor layer 230 and the P-type semiconductor layer 140, and a first gate electrode 160 and a second gate electrode 260 may be formed on the second gate insulation layer 150.

A step (S204) of FIG. 13 is substantially the same as a step (S104) of FIG. 9 described above with reference to FIG. 10D. Thus, a description of a step (S204) of FIG. 13 is omitted. (S204 of FIG. 13)

Fifth, an interlayer dielectric 190 may be formed on the second N-type semiconductor layer 230, the P-type semiconductor layer 140, the first gate electrode 160, and the second gate electrode 260, and the first to fourth contact holes CT1 to CT4 may be formed in the interlayer dielectric 190.

A step (S205) of FIG. 13 is substantially the same as a step (S105) of FIG. 9 described above with reference to FIG. 10E. Thus, a description of a step (S205) of FIG. 13 is omitted. (S205 of FIG. 13)

Sixth, a first source electrode 170, a first drain electrode 180, a second source electrode 270, and a second drain electrode 280 may be formed on the interlayer dielectric 190.

A step (S206) of FIG. 13 is substantially the same as a step (S106) of FIG. 9 described above with reference to FIG. 10E. Thus, a description of a step (S206) of FIG. 13 is omitted. (S206 of FIG. 13)

As described above, in an aspect of the present disclosure, the first N-type semiconductor layer 130 and the P-type semiconductor layer 140 may be successively deposited in one chamber while maintaining a vacuum state. As a result, in an aspect of the present disclosure, an interface of the first N-type semiconductor layer 130 and the P-type semiconductor layer 140 may be stably formed, and moreover, the P-type semiconductor layer 140 may be formed of $Cu_2O$ instead of CuO. Accordingly, in an aspect of the present disclosure, a driving transistor having all of the N-type semiconductor characteristic and the P-type semiconductor characteristic may be formed.

As described above, according to the aspects of the present disclosure, an area where the bottom gate electrode overlaps the first N-type semiconductor layer may be provided as the first channel area between the first source electrode and the first drain electrode, and an area where the first gate electrode overlaps the P-type semiconductor layer may be provided as the second channel area between the second source electrode and the second drain electrode. As a result, according to the aspects of the present disclosure, the first channel area may be implemented to have the N-type semiconductor characteristic, and the second channel area may be implemented to have the P-type semiconductor characteristic. That is, according to the aspects of the present disclosure, since the first N-type semiconductor layer and the P-type semiconductor layer are all provided, the first channel area which is implemented by the first N-type semiconductor layer and has the N-type semiconductor characteristic and the second channel area which is implemented by the P-type semiconductor layer and has the P-type semiconductor characteristic may all be used.

Moreover, according to the aspects of the present disclosure, the threshold voltage of the first N-type semiconductor layer may be set greater than half of the drain voltage applied to the first drain electrode, and thus, the first N-type semiconductor layer may be deactivated even without applying the bias voltage to the bottom gate electrode. Therefore, according to the aspects of the present disclosure, a driving stability of the driving transistor is enhanced even without the first source electrode being connected to the bottom gate electrode of the driving transistor. Also, according to the aspects of the present disclosure, if the driving transistor uses only a P-type semiconductor transistor, the bottom gate electrode is not needed, and thus, the bottom gate electrode may be omitted.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A thin film transistor comprising:
   an N-type semiconductor layer;
   a P-type semiconductor layer on the N-type semiconductor layer;
   a first gate electrode over the P-type semiconductor layer;
   a gate insulation layer between the first gate electrode and the P-type semiconductor layer;
   a first source electrode connected to a first side of the P-type semiconductor layer; and
   a first drain electrode connected to a second side of the P-type semiconductor layer.

2. The thin film transistor of claim 1, wherein when, a threshold voltage of the N-type semiconductor layer satisfies where $$Vth_{N1} > \frac{DV}{2},$$

$Vth_{N1}$ is the threshold voltage of the N-type semiconductor layer is and DV is a drain voltage applied to the first drain electrode.

3. The thin film transistor of claim 1, wherein
   the first source electrode includes a first source electrode layer contacting the P-type semiconductor layer and having a P-type semiconductor characteristic, and a second source electrode layer disposed on the first source electrode layer, and
   the first drain electrode includes a first drain electrode layer contacting the P-type semiconductor layer and having the P-type semiconductor characteristic, and a second drain electrode layer disposed on the first drain electrode layer.

4. The thin film transistor of claim 3, wherein the P-type semiconductor layer, the first source electrode layer, and the first drain electrode layer are formed of the same material.

5. The thin film transistor of claim 1, wherein the P-type semiconductor layer has a thickness thinner than a thickness of the N-type semiconductor layer.

6. The thin film transistor of claim 1, wherein the N-type semiconductor layer is an N-type oxide semiconductor layer, and the P-type semiconductor layer is a P-type oxide semiconductor layer.

7. The thin film transistor of claim 6, wherein the P-type semiconductor layer includes $Cu_2O$.

8. A method of manufacturing a thin film transistor, the method comprising:
   forming a first N-type semiconductor layer and a P-type semiconductor layer of a first thin film transistor and a second N-type semiconductor layer of a second thin film transistor, on a first gate insulation layer;
   forming a second gate insulation layer on the P-type semiconductor layer and forming the second gate insulation on the second N-type semiconductor layer;
   forming a first gate electrode overlapping the P-type semiconductor layer on the second gate insulation layer and a second gate electrode overlapping the second N-type semiconductor layer on the second gate insulation layer;
   forming an interlayer dielectric on the first gate electrode and the second gate electrode;
   forming first and second contact holes exposing a portion of the P-type semiconductor layer to pass through the interlayer dielectric, and third and fourth contact holes exposing a portion of the second N-type semiconductor layer; and
   forming a first source electrode connected to the P-type semiconductor layer through the first contact hole, a first drain electrode connected to the P-type semiconductor layer through the second contact hole, a second source electrode connected to the second N-type semiconductor layer through the third contact hole, and a second drain electrode connected to the second N-type semiconductor layer through the fourth contact hole, on the interlayer dielectric.

9. The method of claim 8, wherein a threshold voltage of the first N-type semiconductor layer satisfies $$Vth_{N1} > \frac{DV}{2},$$

where $Vth_{N1}$ is the threshold voltage of the first N-type semiconductor layer and DV is a drain voltage applied to the first drain electrode.

10. The method of claim 8, wherein the P-type semiconductor layer has a thickness thinner than a thickness of the first N-type semiconductor layer.

11. The method of claim 8, wherein the first N-type semiconductor layer and the second N-type semiconductor layer are an N-type oxide semiconductor layer, and the P-type semiconductor layer is a P-type oxide semiconductor layer.

12. The thin film transistor of claim 11, wherein the P-type semiconductor layer includes $Cu_2O$.

13. An organic light emitting display device comprising:
   a pixel including an organic light emitting diode, a first thin film transistor, and a second thin film transistor, and connected to a scan line and a data line,
   wherein the first thin film transistor has a first N-type semiconductor layer and a P-type semiconductor layer is disposed on the first N-type semiconductor layer, and the second thin film transistor has a second N-type semiconductor layer.

14. The organic light emitting display device of claim 13, wherein a threshold voltage of the first N-type semiconductor layer satisfies $$Vth_{N1} > \frac{DV}{2},$$

where $Vth_{N1}$ is a threshold voltage of the first N-type semiconductor layer and DV is a source voltage.

15. The organic light emitting display device of claim 13, wherein the first thin film transistor further comprises:
   a first gate electrode on the P-type semiconductor layer;
   a gate insulation layer between the first gate electrode and the P-type semiconductor layer;

a first source electrode connected to a first side of the P-type semiconductor layer; and a first drain electrode connected to a second side of the P-type semiconductor layer.

16. The organic light emitting display device of claim 15, wherein each of the first and second source electrodes comprises a first source electrode layer contacting the P-type semiconductor layer and having a P-type semiconductor characteristic, and a second source electrode layer disposed on the first source electrode layer, and each of the first and second drain electrodes comprises a first drain electrode layer contacting the P-type semiconductor layer and having the P-type semiconductor characteristic, and a second drain electrode layer disposed on the first drain electrode layer.

17. The organic light emitting display device of claim 16, wherein the P-type semiconductor layer, the first source electrode layer, and the first drain electrode layer are formed of the same material.

18. The organic light emitting display device of claim 13, wherein a thickness of the P-type semiconductor layer is thinner than a thickness of the first N-type semiconductor layer.

19. The organic light emitting display device of claim 13, wherein each of the first and second N-type semiconductor layers is an N-type oxide semiconductor layer, and the first P-type semiconductor layer is a P-type oxide semiconductor layer.

20. The organic light emitting display device of claim 19, wherein the P-type semiconductor layer includes $Cu_2O$.

* * * * *